United States Patent
Lee et al.

(10) Patent No.: US 11,262,874 B2
(45) Date of Patent: Mar. 1, 2022

(54) TOUCH SENSING DEVICE CAPABLE OF PERFORMING TOUCH SENSING AND FORCE SENSING USING SINGLE SENSING STRUCTURE AND ELECTRIC DEVICE INCLUDING THE SAME

(71) Applicant: Samsung Electro-Mechanics Co., Ltd., Suwon-si (KR)

(72) Inventors: Joo Hyoung Lee, Suwon-si (KR); Joo Yul Ko, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/829,571

(22) Filed: Mar. 25, 2020

(65) Prior Publication Data
US 2021/0034177 A1    Feb. 4, 2021

(30) Foreign Application Priority Data

Aug. 2, 2019 (KR) .......................... 10-2019-0094471
Dec. 17, 2019 (KR) .......................... 10-2019-0168652

(51) Int. Cl.
*G06F 3/044* (2006.01)
*G01L 1/14* (2006.01)

(52) U.S. Cl.
CPC .............. *G06F 3/044* (2013.01); *G01L 1/144* (2013.01); *G06F 2203/04105* (2013.01)

(58) Field of Classification Search
CPC ........... G06F 3/044; G06F 2203/04105; G06F 3/0416; G01L 1/144; G01L 1/14; H03K 2217/96054; H03K 2217/9651; H03K 17/9545; H03K 17/962; H03K 17/97; H03K 2017/9706
See application file for complete search history.

(56) References Cited

U.S. PATENT DOCUMENTS

| | | | | |
|---|---|---|---|---|
| 8,723,833 | B2* | 5/2014 | Curtis | G06F 3/0446 345/174 |
| 8,729,913 | B2* | 5/2014 | Maharyta | G06F 3/04166 324/679 |
| 9,341,530 | B2* | 5/2016 | Lee | G01L 9/007 |
| 10,790,824 | B1* | 9/2020 | Ryu | G06F 3/04166 |
| 11,003,275 | B2* | 5/2021 | Ryu | G06F 3/044 |

(Continued)

FOREIGN PATENT DOCUMENTS

| | | |
|---|---|---|
| JP | 2012-168747 A | 9/2012 |
| JP | 2015-95865 A | 5/2015 |

(Continued)

*Primary Examiner* — Grant Sitta
(74) *Attorney, Agent, or Firm* — NSIP Law

(57) ABSTRACT

A touch sensing device, applicable to an electric device including a touch member integrated with a housing, includes an inductor element spaced apart from an internal side surface of the touch member, a support member attached to an internal side surface of the housing or the touch member to support the inductor element disposed thereon, a substrate on which the inductor element is mounted, the substrate being disposed on the support member, and a circuit part connected to the inductor element and configured to detect a touch input and a touch-force input in response to different frequency change characteristics depending on the touch input and the touch-force input through the touch member.

22 Claims, 17 Drawing Sheets

(56) References Cited

U.S. PATENT DOCUMENTS

| | | | |
|---|---|---|---|
| 11,003,280 B2* | 5/2021 | Lee | G06F 3/04166 |
| 2004/0105040 A1* | 6/2004 | Oh | G06F 3/0445 |
| | | | 349/12 |
| 2005/0180082 A1* | 8/2005 | Nakamura | H01H 13/85 |
| | | | 361/139 |
| 2011/0018556 A1* | 1/2011 | Le | H03K 17/9622 |
| | | | 324/654 |
| 2011/0216032 A1* | 9/2011 | Oda | G06F 3/0446 |
| | | | 345/174 |
| 2012/0306824 A1* | 12/2012 | Horie | G06F 3/0446 |
| | | | 345/179 |
| 2013/0098170 A1* | 4/2013 | Lee | G01L 9/007 |
| | | | 73/862.626 |
| 2015/0035793 A1* | 2/2015 | Hirotsune | G06F 3/0416 |
| | | | 345/174 |
| 2015/0035794 A1* | 2/2015 | Zhitomirskiy | G06F 3/0445 |
| | | | 345/174 |
| 2015/0130649 A1* | 5/2015 | Itakura | H03M 1/0626 |
| | | | 341/157 |
| 2015/0145578 A1* | 5/2015 | Araki | H03L 7/0995 |
| | | | 327/241 |
| 2016/0216798 A1* | 7/2016 | Kim | G06F 3/0445 |
| 2018/0093695 A1* | 4/2018 | Hattori | G01B 7/14 |
| 2018/0120364 A1* | 5/2018 | Lee | G01R 23/10 |
| 2018/0128650 A1* | 5/2018 | Bruwer | H03H 2/005 |
| 2018/0202873 A1* | 7/2018 | Bonifas | G01L 1/14 |
| 2019/0012007 A1* | 1/2019 | Kim | G06F 1/1652 |
| 2019/0101417 A1* | 4/2019 | Patel | G01D 5/245 |
| 2019/0339776 A1* | 11/2019 | Rosenberg | G06F 3/016 |
| 2021/0034186 A1* | 2/2021 | Ryu | G06F 3/0418 |

FOREIGN PATENT DOCUMENTS

| | | |
|---|---|---|
| KR | 10-2011-0087004 A | 8/2011 |
| KR | 10-2011-0087014 A | 8/2011 |
| KR | 10-2018-0046833 A | 5/2018 |

* cited by examiner

TOUCH SENSING DEVICE CAPABLE OF PERFORMING TOUCH SENSING AND FORCE SENSING USING SINGLE SENSING STRUCTURE AND ELECTRIC DEVICE INCLUDING THE SAME

CROSS-REFERENCE TO RELATED APPLICATIONS

This application claims the benefit under 35 USC 119(a) of Korean Patent Application Nos. 10-2019-0094471 filed on Aug. 2, 2019, and 10-2019-0168652 filed on Dec. 17, 2019, in the Korean Intellectual Property Office, the entire disclosures of which are incorporated herein by reference for all purposes.

BACKGROUND

1. Field

This disclosure relates to a touch sensing device, capable of performing touch sensing and force sensing using a single sensing structure, and an electric device including the touch sensing device.

2. Description of the Background

Generally, a wearable device has been preferred to have a thinner, simpler, but cleaner design. Therefore, an existing mechanical switch has disappeared therefrom. This may be achieved by implementing dustproof and waterproof technology and developing a seamless model having a smooth design.

Currently, technology such as touch on metal (ToM) technology of performing a touch on a metal, capacitor sensing technology using a touch panel, a micro-electromechanical system (MEMS), a micro strain gauge, or the like, is being developed. Furthermore, a force touch function is being developed.

An existing mechanical switch may require a large size and space internally to implement a switching function, and may have a cluttered design and may require a large amount of space due to a form in which the existing mechanical switch protrudes outwardly, a structure in which the existing mechanical switch is not integrated with an external case, or the like, in terms of appearance.

In addition, there is a risk of electric shock caused by directly touching the mechanical switch which is electrically connected, and particularly, it may be difficult to implement a dustproof function and a waterproof function due to a structure of the mechanical switch.

Moreover, an existing switch device has been required to perform a touch sensing function and a force sensing function at the same time.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a touch sensing device, applicable to an electric device including a touch member integrated with a housing, includes an inductor element spaced apart from an internal side surface of the touch member, a support member disposed on an internal side surface of the housing or the touch member to support the inductor element disposed thereon, a substrate on which the inductor element is disposed, the substrate being disposed on the support member, and a circuit part connected to the inductor element and configured to detect a touch input and a touch-force input in response to different frequency change characteristics depending on the touch input and the touch-force input through the touch member.

The substrate may be disposed between the support member and the inductor element.

The circuit part may include an amplifier circuit of an oscillation circuit and an operation detection circuit. The oscillation circuit may further include a capacitor element disposed on the substrate, and may include the amplifier circuit, included in the circuit part, to generate an oscillation signal, having first frequency change characteristics in response to parasitic capacitance formed in the substrate when a touch is input to the touch member, and an oscillation signal having second frequency change characteristics in response to a change in a distance between the touch member and the inductor element when force is input to the touch member. The operation detection circuit may detect a touch input and a force-touch input in response to the first and second frequency change characteristics of the oscillation signal from the oscillation circuit.

The support member may include one end attached to a portion of the internal side surface of the housing or the touch member, another end attached to another portion of the internal side surface of the housing or the touch member, a support extending between the one end and the other end to be spaced apart from the internal side surface of the housing or the touch member, wherein the support member may be formed of a conductor and may support the substrate.

The oscillation circuit may further include an inductance circuit including the inductor element mounted on the substrate, a capacitance circuit including a capacitor element mounted on the substrate and connected to the inductance circuit, and the amplifier circuit configured to generate the oscillation signal having a resonant frequency formed by the inductance circuit and the capacitance circuit.

The oscillation circuit may be configured to generate the oscillation signal having capacitance, changed when a touch is input through the touch member, and having the first frequency change characteristics in response to the change in the capacitance. The oscillation circuit may be configured to generate the oscillation signal having capacitance, changed when touch-force is input through the touch member, and having the second frequency change characteristics in response to the change in the capacitance.

The operation detection circuit may include a frequency digital converter configured to count a clock signal using the oscillation signal from the oscillation circuit to generate a count value, and an operation detector configured to detect one or more of a touch input and a touch-force input in response to the count value from the frequency digital converter.

The frequency digital converter may include a frequency down-converter configured to divide a reference clock signal using a reference frequency division ratio to generate a divided reference clock signal, a periodic timer configured to count one period of time of the divided reference clock signal, received from the frequency down-converter, using the oscillation signal to generate a periodic count value, and a cascade integrator-comb (CIC) filter circuit configured to perform cumulative amplification on the periodic count value, received from the periodic timer, to generate the count value.

The operation detector may include a delay circuit configured to delay the count value, received from the frequency digital converter, by a time determined in response to a delay control signal to generate a delayed count value, a subtraction circuit configured to subtract the count value from the delayed count value from the delay circuit to generate a difference value, and a touch-force slope detection circuit configured to compare the difference value with each of a preset touch threshold value and a force threshold value to output touch detection signals, having different detection information from each other, in response to a comparison result.

The support member may include a conductive member attached to a portion of the internal side surface of the housing or the touch member and disposed on a portion, or an entirety, of an area between the substrate and the support, and the support member may be formed of an insulator and support the substrate.

In another general aspect, an electric device includes a touch member integrated with a housing, an inductor element spaced apart from an internal side surface of the touch member, a support member disposed on an internal side surface of the housing or the touch member to support the inductor element spaced apart from the internal side surface of the touch member, a substrate on which the inductor element is disposed, the substrate being disposed between the support member and the inductor element, and a circuit part connected to the inductor element and configured to detect a touch input and a touch-force input in response to different frequency change characteristics depending on the touch input and the touch-force input through the touch member.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
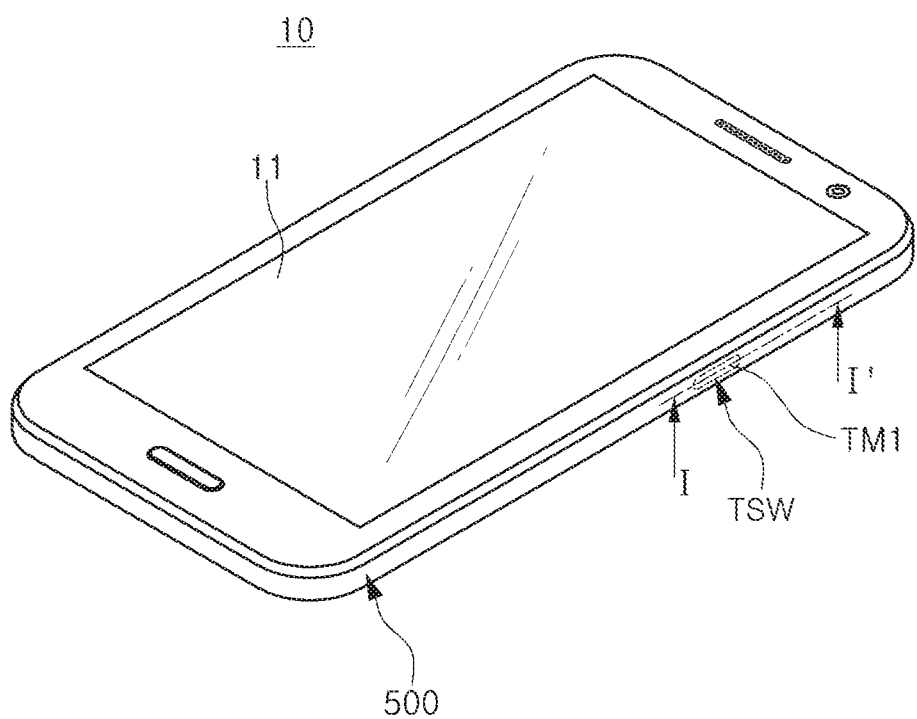
FIG. 1 illustrates one or more examples of an electric device according to an embodiment.

Hereinafter, while examples of the present disclosure will be described in detail with reference to the accompanying drawings, it is noted that examples are not limited to the same.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. As used herein "portion" of an element may include the whole element or less than the whole element.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms, such as "above," "upper," "below," "lower," and the like, may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above," or "upper" relative to another element would then be "below," or "lower" relative to the other element. Thus, the term "above" encompasses both the above and below orientations depending on the spatial orientation of the device. The device may be also be oriented in other ways (rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of this disclosure. Further, although the examples described herein have a variety of configurations, other configurations are possible as will be apparent after an understanding of this disclosure.

Herein, it is noted that use of the term "may" with respect to an example, for example, as to what an example may include or implement, means that at least one example exists in which such a feature is included or implemented while all examples are not limited thereto.

An aspect of the present disclosure is to provide a touch sensing device, capable of distinguishing and recognizing touch sensing and touch-force sensing using a single sensor, and an electric device including the touch sensing device.

FIG. 1 illustrates one or more examples of an electric device according to an embodiment.

Referring to FIG. 1, an electric device 10 according to the examples described herein may include a touch screen 11, a housing 500, and a touch operation unit TSW (touch switch unit).

The touch operation unit TSW may include at least one touch member TM1 to sense touch operation input.

As an example, referring to FIG. 1, the electric device 10 may be a portable device such as a smartphone, or may be a wearable device such as a smartwatch. The electric device 10 is not limited to a specific device, and may be a portable or wearable electric device or an electric device having a switch for operation control.

The housing 500 may be an external case exposed outwardly of the electric device 10. As an example, when a touch sensing device is applied to a mobile device, the touch sensing device may be a cover disposed on a side surface of the electric device 10. As an example, the housing 500 may be integrated with a cover disposed on a rear surface of the electric device 10 or may be separated from the cover disposed on the rear surface of the electric device 10.

Figure 2:
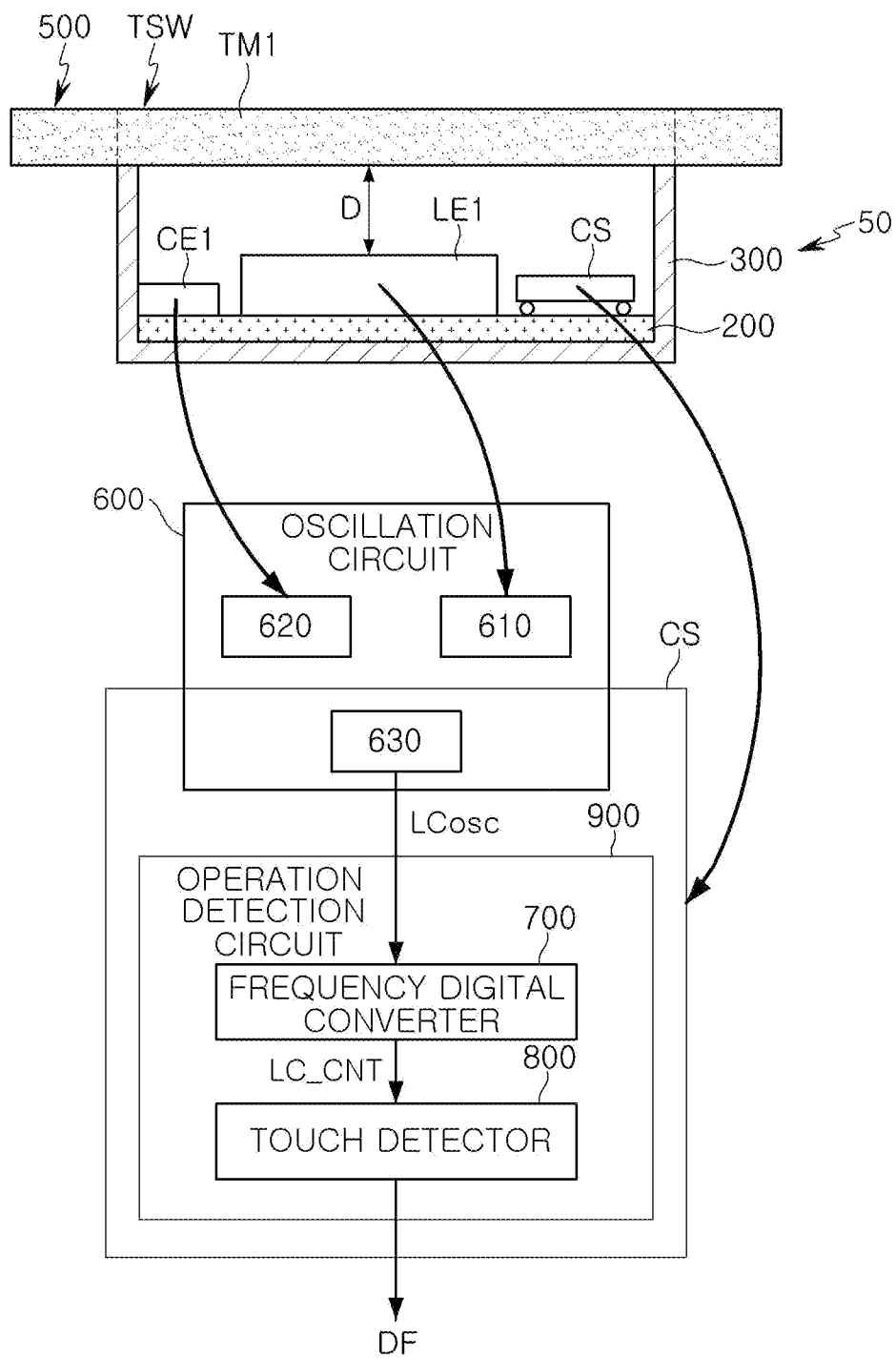
FIG. 2 illustrates one or more examples of an electric device and a touch sensing device having a cross-sectional structure taken along line I-I' in FIG. 1.

The touch operation unit TSW may be disposed in the housing 500 of the electric device, but a disposition of the touch operation unit is not limited thereto. A touch sensing device 50 may be disposed in the housing 500 of an electric device 10 (FIG. 2). Referring to FIG. 1, the touch operation unit TSW may be disposed on a cover of a mobile device. In this case, the cover may be disposed on a cover other than a touch screen, for example, a side cover, a rear cover, or a cover disposed on a portion of a front surface. For ease of description, a housing disposed on a side cover of a mobile device will be described as an example of the housing, but a disposition of the housing is not limited thereto.

The touch operation unit TSW may be a portion of the housing 500, and refers to a touch area including at least one touch member, capable of sensing a touch or touch force.

When describing the accompanying drawings, repeated descriptions may be omitted for components having the same reference numeral and the same function, and only differences may be described.

FIG. 2 illustrates one or more examples of an electric device and a touch sensing device having a cross-sectional structure taken along line I-I' in FIG. 1.

Referring to FIG. 2, an electric device 10 according to the examples described herein, may include a touch operation unit TSW and a touch sensing device 50.

The touch sensing device 50 may include an inductor element LE1, a support member 300, a substrate 200, and a circuit part CS.

The touch operation unit TSW may include a touch member TM1 integrated with the housing 500.

The inductor element LE1 may be mounted on one surface of the substrate 200 to be spaced apart from an internal surface of the touch member TM1 by a predetermined distance D.

The inductor element LE1 is spaced apart from an internal side surface of the touch member TM1 by a predetermined distance D. The predetermined distance D may be preset to respond to application of force following a touch through the touch member TM1.

The support member 300 may be attached to an internal side surface of the housing 500 or the touch member TM1 to support the inductor element LE1 and the substrate 200 such that the inductor element LE1 and the substrate 200 are spaced apart from the internal side surface of the housing 500 or the touch member TM1.

The circuit part CS may be connected to the inductor element LE1 to generate an oscillation signal LCosc having different frequency change characteristics for each of the touch input and the touch-force input through the touch member TM1. The circuit part CS may detect the touch input and the touch-force input based on the frequency change characteristics of the oscillation signal LCosc.

As an example, the substrate 200 may be supported by the support member 300, and an inductor element LE1 such as a coil component, a capacitor element CE1 such as multilayer ceramic capacitor (MLCC), and the circuit part CS (for example, an integrated circuit) may be mounted on one surface of the substrate 200. The support member 300 may be disposed on the other surface of the substrate 200. The inductor element LE1, the capacitor element CE1, and the circuit part CS may be electrically connected to each other through the substrate 200.

As an example, one surface of the substrate 200 may face the internal side surface of the touch member TM1, and the other surface of the substrate 200 may oppose the one surface thereof, but is not limited thereto.

The circuit part CS may include an amplifier circuit 630 of the oscillation circuit 600 and an operation detection circuit 900.

The oscillation circuit 600 may include the inductor element LE1 and the capacitor element CE1 mounted on the substrate 200, and may include the amplifier circuit 630, included in the circuit part CS, to generate an oscillation signal LCosc having different frequency change characteristics for each of the touch input and the touch-force input through the touch member TM1.

As an example, the oscillation circuit 600 may generate an oscillation signal having first frequency change characteristics depending on parasitic capacitance in a substrate disposed between the support member 300 and the inductor element LE1 when a touch of a touch member is input, and may generate an oscillation signal having second frequency change characteristics based on a change in a distance between the touch member and the inductor element when force is input to the touch member.

The operation detection circuit 900 may detect the touch or the touch-force input based on the first and second frequency change characteristics of the oscillation signal LCosc from the oscillation circuit 600.

For example, the oscillation circuit 600 may include an inductance circuit 610, a capacitance circuit 620, and an amplifier circuit 630.

The inductance circuit 610 may include an inductor element LE1 and may have inductance variable when force is input through the first touch member TM1 by a conductor or a non-conductor. The capacitance circuit 620 may include a capacitor element CE1 and may have a capacitance variable when a touch is input through the first touch member TM1 by a conductor (for example, a human body).

As an example, the operation detection circuit 900 may include a frequency digital converter 700 and a touch detector 800.

The frequency digital converter 700 may convert the oscillation signal from the oscillation circuit 600 into a digital value to generate a count value LC_CNT.

The touch detector 800 may distinguish and detect whether a touch is input or touch force is input, based on a count value input from the frequency digital converter 700.

A ferrite sheet, not illustrated, may be disposed on a lower surface of the inductor element LE1, but is not necessarily required. The inductor element LE1 does not need to have a specifically defined shape, and may have various patterns such as a circle, a rectangle, and the like. The inductor element LE1 may be configured as a flexible printed circuit board (PCB) (FPCB) itself and may also be replaced with a chip inductor.

The substrate 200 may be an FPCB, and may be various types of PCB, other than the FPCB. The circuit part CS for sensing, the inductor element LE1, and the capacitor element CE1 may be disposed on a mounting surface of the substrate 200 or a surface opposing the mounting surface.

As described above, due to the sensing structure, inductive sensing may be performed depending on a change in inductance based on a distance between the touch member TM1 and the inductor element LE1 when the touch member TM is touched to be pressed. In addition, capacitive sensing may be also performed depending on a change in capacitance based on a parasitic capacitor formed between the support member 300, electrically connected to the touch member TM, and the inductor element LE1 through the substrate 200.

For example, when the support member 300 connected to the touch member TM1 of the housing 500 is a type of metal, the touch member TM1 is electrically connected to form a parasitic capacitor in the substrate 200 between the inductor element LE1 and the support member 300. In this case, a touch may be recognized by sensing a change in a resonant frequency caused by LC resonance of the oscillation circuit 600 depending on whether there is a parasitic capacitor.

As described herein, a touch or a touch input means that a conductor such as a human hand approaches or touches a touch member of a housing, and a resonant frequency may be decreased by parasitic capacitance formed by the touch or the touch input. Force or a force input means that force is input by a conductor such as a human hand or a non-conductor such as plastic to press a touch member of a housing, and thus, a distance between the touch member of the housing and an inductor element may be changed and such a change in distance may cause a resonant frequency to be increased. In addition, a touch-force input means that the touch input and the force input are simultaneously performed, and thus, a resonant frequency is deceased, then increased, and then decreased by the inductance change and capacitance change.

Sensing "force only" having no touch, and description of the force sensing will be given for conceptual understanding, and touch sensing or touch-force sensing may be performed as described in the examples disclosed herein.

A sensing structure of the touch sensing device of the examples disclosed herein is not limited to that illustrated in FIG. 2. The concept of the examples disclosed herein may include a structure, as the sensing structure of the touch sensing device, in which a constant distance between the touch member TM1 and the inductor element LE1 may be maintained using the support member 300 to perform inductive sensing based on a change in the distance caused by force input and a support member electrically connected to the touch member may form parasitic capacitance between another conductor and an inductor when the touch member is touched by a conductor.

When describing the drawings of the examples disclosed herein, repeated descriptions may be omitted for components having the same reference numeral and the same function, and only differences may be described.

Figure 3:
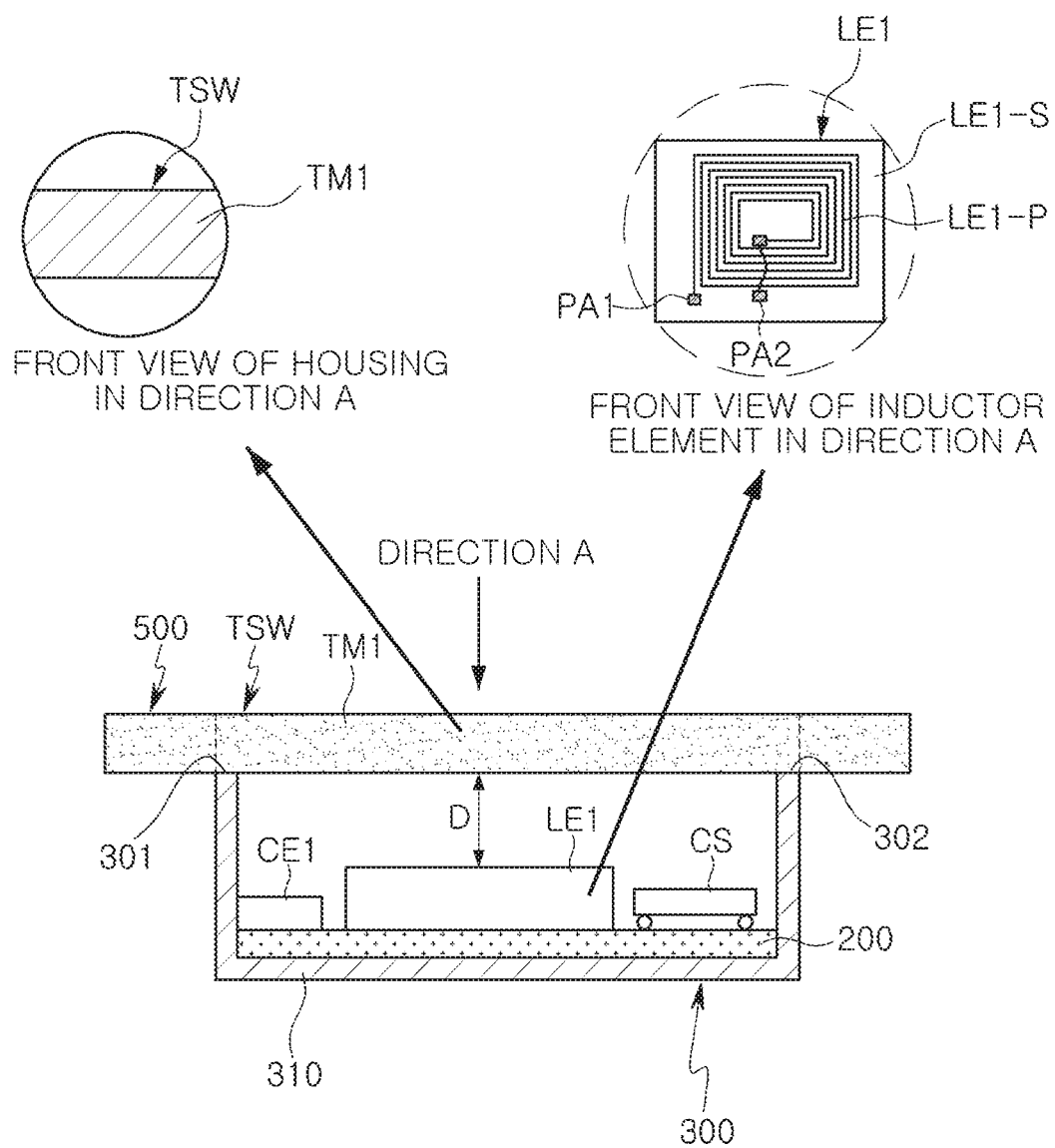
FIG. 3 illustrates one or more examples of an electric device and a touch sensing device having a cross-sectional structure taken along line I-I' in FIG. 1.

FIG. 3 illustrates one or more examples of an electric device and a touch sensing device having a cross-sectional structure taken along line I-I' in FIG. 1.

Referring to FIG. 3, in the touch sensing device according to one or more examples, the support member 300 may include a support 310 formed between one end 301 and the other end 302 of the support member 300.

The one end 301 of the support member 300 may be attached to a portion of an internal side surface of the housing 500 or the touch member TM1, and the other end 302 of the support member 300 may be attached to another portion of the internal surface of the housing 500 or the touch member TM1. The support 310 may be spaced apart from the internal side surface of the housing 500 or the touch member TM1.

As an example, the support 310 may be formed of a conductor and may support the substrate 200.

The substrate 200 may be disposed between the support 310 of the support member 300 and the inductor element LE1.

Referring to a front view of the housing 500 in a direction A in FIG. 3, as an example, the housing 500 may be formed of a conductor such as a metal. The touch member TM1 may be formed of a conductor such as a metal.

Referring to a front view of the inductor element LE1 in the direction A in FIG. 3, as an example, the inductor element LE1 may include a coil pattern LE1-P connected between a first connection pad PA1 and a second connection pad PA2 in a winding type. The coil pattern LE1-P may be a PCB pattern formed on a coil substrate LE1-S. The first connection pad PA1 and the second connection pad PA2 may be electrically connected to the circuit part CS and the capacitor element CE1 through the substrate 200.

The structure of the touch sensing device, illustrated in FIG. 3, is merely exemplary and is not limited thereto.

Another embodiment of the touch sensing device, included in the concept of the examples disclosed herein, will be described with reference to FIGS. 4 and 5, and descriptions repetitive of those in FIG. 3 may be omitted while descriptions different thereto may be given more focus.

Figure 4:
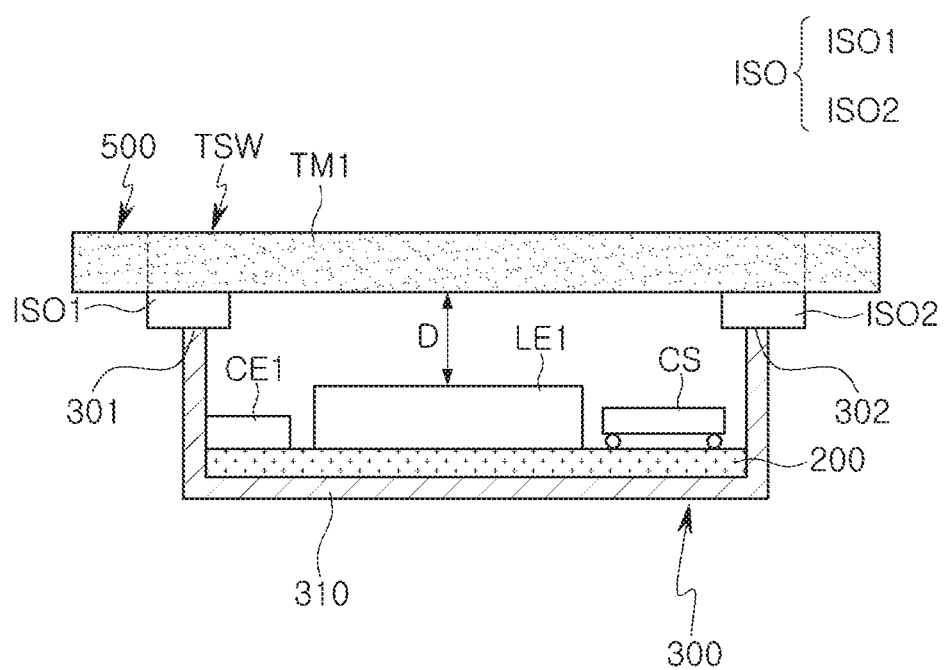
FIG. 4 illustrates one or more examples of an electric device and a touch sensing device having a cross-sectional structure taken along line I-I' in FIG. 1.

FIG. 4 illustrates one or more examples of an electric device and a touch sensing device having a cross-sectional structure taken along line I-I' in FIG. 1.

Referring to FIG. 4, a support member 300 may include a support 310 formed between one end 301 and the other end 302 of the support member 300. The support member 300 may be attached to an internal side surface of the housing 500 or the touch member TM1 through first and second insulating members ISO1 and ISO2. As an example, although the insulating member ISO is illustrated as including the first and second insulating members ISO1 and ISO2 in FIG. 4, insulating members are not limited thereto and may be integrated into a single body.

For example, the one end 301 of the support member 300 may be attached to a portion of the internal side surface of the housing 500 or the touch member TM1 through a first insulating member ISO1, the other end 302 of the support member 300 may be attached to another portion of the internal side surface of the housing 500 or the touch member TM1 through a second insulating member ISO2. The support 310 of the support member 300 may be spaced apart from the internal side surface of the housing 500 or the touch member TM1 to support a substrate 200.

The support 310 may be formed of a conductor and may support the substrate 200.

The substrate 200 may be disposed between the support 310 of the support member 300 and the inductor element LE1.

For example, the touch member TM1 and the support member 300 may be insulated by the insulating member ISO, for example, first insulating member ISO1 and second insulating member ISO2.

The connection between the touch member TM1 and the support member 300 may be achieved irrespective of whether the insulating member ISO, for example, first insulating member ISO1 and second insulating member ISO2, is a metal. Even in the case in which the insulating member ISO, for example, first insulating member ISO1 and second insulating member ISO2, is a non-metal, a parasitic capacitor is formed between the touch member TM1 and the support member 300, each having conductivity, when a touch is input through the touch member TM1. Therefore, capacitive sensing may be performed.

Figure 5:
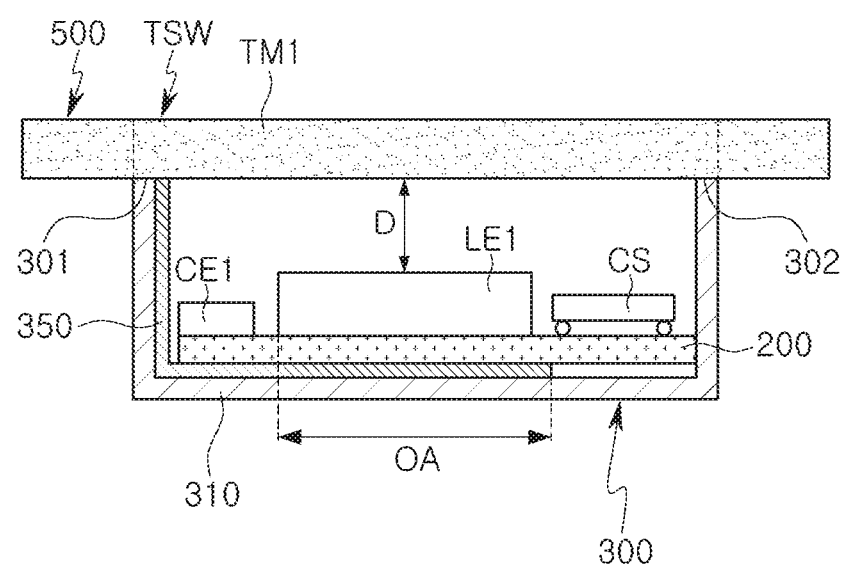
FIG. 5 illustrates one or more examples of an electric device and a touch sensing device having a cross-sectional structure taken along line I-I' in FIG. 1.

FIG. 5 illustrates one or more examples of another structure of a touch sensing device.

Referring to FIG. 5, a support member 300 may include a support 310 formed between one end 301 and the other end 302 of the support member 300.

The one end 310 of the support member 300 may be attached to a portion of an internal side surface of a housing 500 or a touch member TM1, and the other end 302 of the support member 300 may be attached to another portion of the internal side surface of the housing 500 or the touch member TM1. The support 310 of the support member 300 may be spaced apart from the internal side surface of the housing 500 or the touch member TM1.

Unlike the support 310, formed of a conductor, in FIG. 4, the support 310 in FIG. 5 may be formed of an insulator.

The support member 300 may further include a conductive member 350. The conductive member 350 may be attached to a portion of the internal side surface of the housing 500 or the touch member TM1, and may be disposed on a portion, or the entirety, of an area between the substrate 200 and the support 310. As an example, the conductive member 350 may include an overlapping area OA, overlapping the substrate 200, for capacitance sensing.

Since the conductive member 350 is connected to the touch member TM1, parasitic capacitance may be formed between the conductive member 350 and the inductor element LE1 when the touch is input to the touch member TM1. Therefore, capacitance formed by the touch may vary.

For example, the support member 300 may be formed of a non-metal. In this case, the touch member TM1 and the support member 300 are electrically insulated from each other. For example, when the support member 300 is formed of a material such as plastic, electrical connection, or the like, does not occur when the support member 300 is in contact with another component.

As described above, the support member 300 has a function of maintaining a constant distance between the touch member TM1 and the inductor element LE1 when it is attached to the housing 500 while supporting the substrate 200. On the other hand, capacitive sensing may be performed through a conductive member 350 connected to the touch member TM1. The conductive member 350, connected to the touch member TM1, may be disposed on a surface opposing a mounting surface of the substrate 200 (a surface facing the internal side surface of the touch member TM1), so that parasitic capacitance may be formed with the inductor element LE1 to perform capacitive sensing.

As an example, the conductive member 350 may be disposed on a layer, not used in the substrate 200.

According to the structure of the touch sensing device illustrated in FIG. 5, a capacitive sensing operation may be implemented while the support member 300 is formed of a non-metal.

Figure 6:
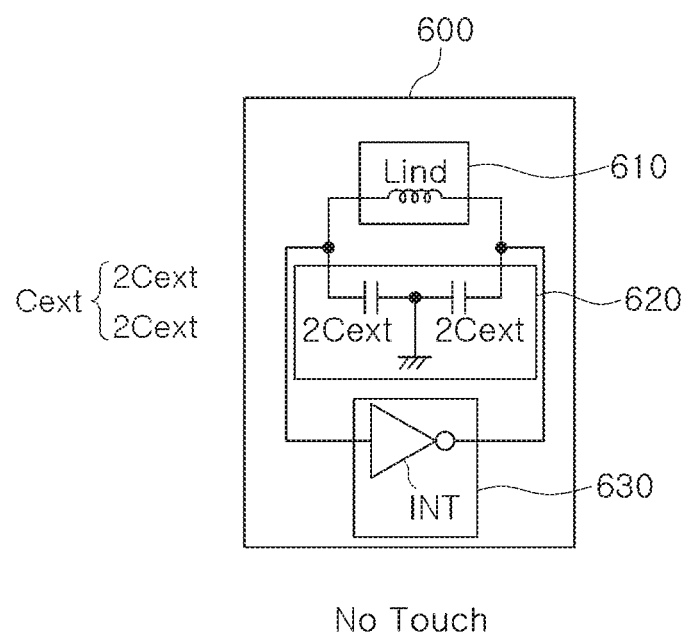
FIG. 6 illustrates one or more examples of an oscillation circuit.

FIG. 6 illustrates one or more examples of an oscillation circuit.

Referring to FIGS. 2 and 6, the oscillation circuit 600 may include an inductance circuit 610, a capacitance circuit 620, and an amplifier circuit 630.

The inductance circuit 610 may include the inductor element LE1 mounted on the substrate 200. As an example, the inductance circuit 610 may include an inductance Lind of the inductor element LE1.

The capacitance circuit 620 may include a capacitor element CE1 mounted on the substrate 200 and connected to the inductance circuit 610. As an example, the capacitance circuit 620 may be represented by a structure having capacitance Cext of the capacitor element CE1.

The amplifier circuit 630 may generate an oscillation signal having a resonant frequency formed by the inductance circuit 610 and the capacitance circuit 620. As an example, the amplifier circuit 630 may include an inverter INT or an amplifier to maintain the resonant frequency formed by the inductance circuit 610 and the capacitance circuit 620.

In an example, the oscillation circuit 600 may include an LC resonant circuit, but is not limited thereto and may generate an oscillation signal based on capacitance, varying as a conductor such as a human hand touches a touch member, and inductance varying depending on force (pressing forces) of a conductor (a metal) or a non-conductor.

As an example, when a touch or force is not input to the touch member TM1 (No Touch or No Force), a first resonant frequency fres1 of the oscillation circuit 600 may be expressed by Equation 1.

$$fres1 \approx \frac{1}{2\pi \sqrt{\text{Lind} \times \text{Cext}}} \quad \text{Equation 1}$$

In Equation 1, ≈ refers to "equal" or "similar". The term "similar" means that other values may be further included.

Figure 7:
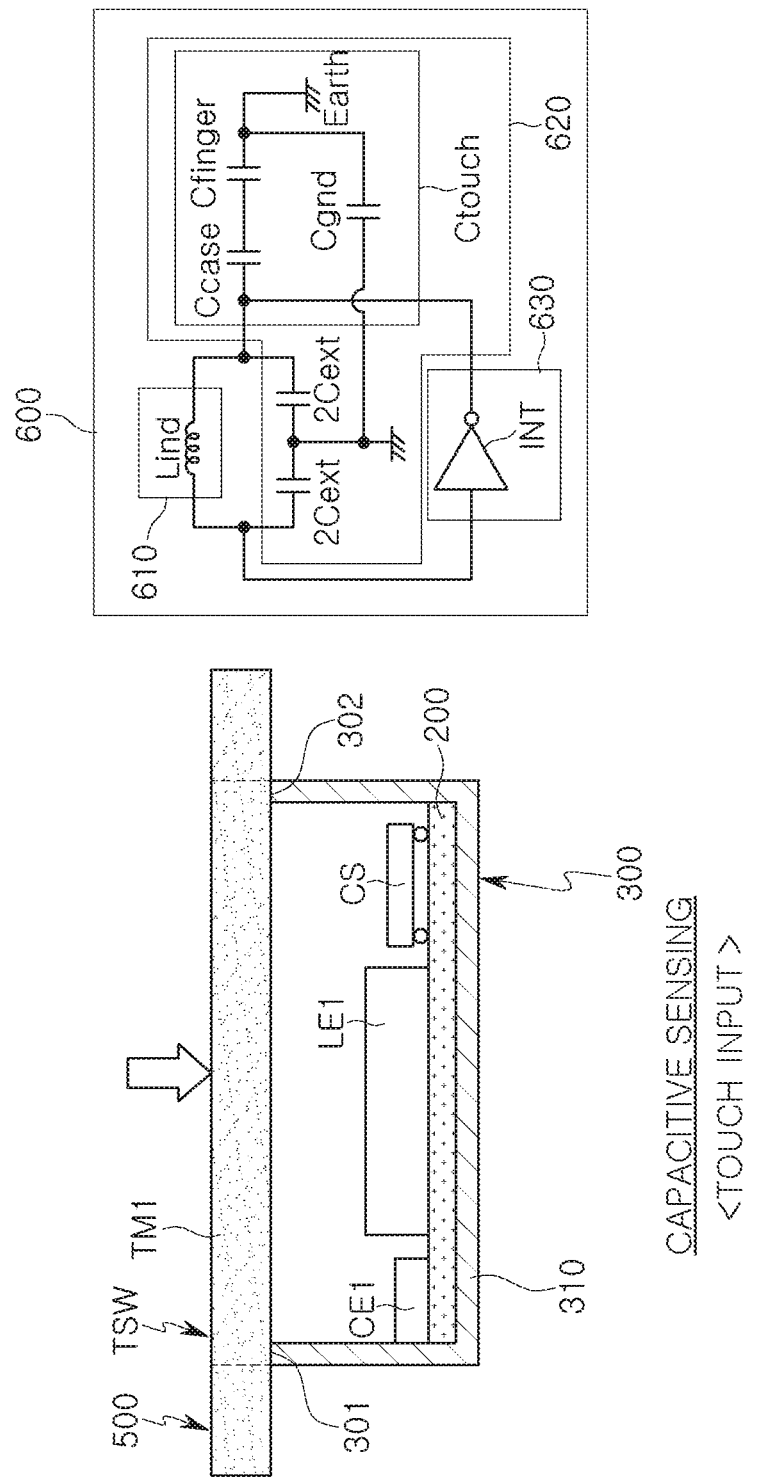
FIG. 7 illustrates a concept of capacitive sensing depending on touch input and one or more examples of an oscillation circuit.

FIG. 7 illustrates a concept of capacitive sensing depending on touch input and one or more examples of an oscillation circuit.

A left drawing of FIG. 7 is a conceptual diagram of capacitive sensing performed when a touch is input, and a right drawing of FIG. 7 illustrates an example an oscillation circuit when a touch is input.

Referring to FIG. 7, the oscillation circuit 600 may have capacitance, variable when a touch is input through the touch member TM1, and may generate the oscillation signal LCosc having first frequency change characteristics depending on variation of the capacitance.

In the operation sensing structure illustrated in the left drawing of FIG. 7, the operation sensing device of the present example performs capacitive sensing when a touch is input to the touch member TM1 by a conductor such as a human body.

As illustrated in the right drawing of FIG. 7, when the touch member TM1 is not touched by a conductor such as a human body, the capacitance circuit 620 of the oscillation circuit 600 may have capacitance Cext (2Cext, 2Cext) of capacitor element CE1 to have touch capacitance Ctouch (Ccase, Cfinger, Cgnd) formed when touched.

For example, the oscillation circuit 600 may generate an oscillation signal LCosc having first frequency change characteristics depending on capacitance varied by an interaction between the touch member TM1, the capacitor element CE1, and a touch object, for example, a human body (finger), when a touch is input through the touch member TM1. As an example, the first frequency change characteristics may include a change in a frequency decreased and then increased as capacitance is changed.

As an example, the first frequency change characteristics will be described later with reference to FIG. 14.

Figure 8:
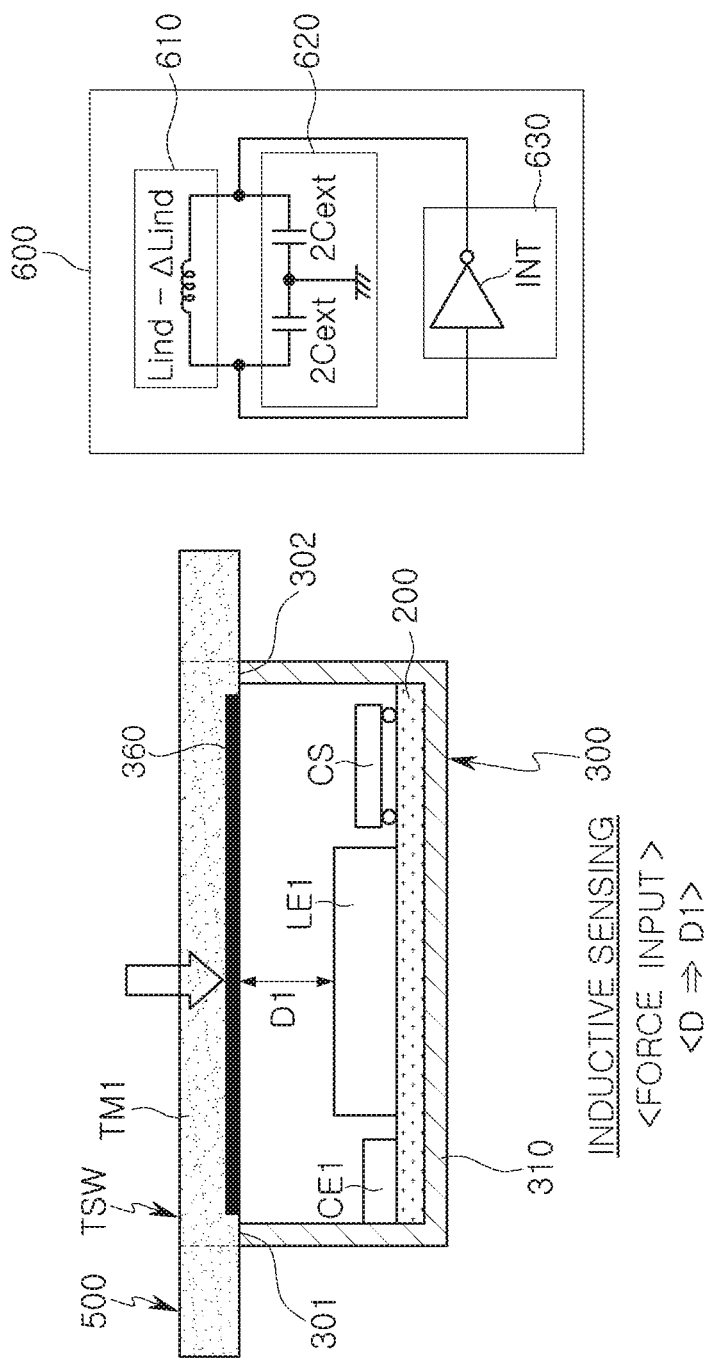
FIG. 8 illustrates a concept of inductive sensing depending on force input and one or more examples of an oscillation circuit.

FIG. 8 illustrates a concept of inductive sensing depending on force input and one or more examples of an oscillation circuit.

A left drawing of FIG. 8 is a conceptual diagram of inductive sensing performed when a force is input, and a right drawing of FIG. 8 illustrates an example of an oscillation circuit when force is input.

Referring to FIG. 8, the oscillation circuit 600 may generate an oscillation signal LCosc having frequency change characteristics depending on variation of inductance varied when force is input through the touch member TM1. This may be merely theoretical and there may not be "force only" having no touch.

For example, when force is input to the touch member TM1 pressed by a conductor, a non-conductor, or the like, a distance between a conductor element 360 and an inductor element LE1, disposed inside of a touch member TM1, may be changed while the touch member TM1 is pressed to bend inwardly. For example, the conductor element 360 may be the touch member TM1, an element disposed in the touch member TM1, or an element disposed on an inner surface of the touch member TM1. While current is input to an inductor element LE1, a distance between the conductor element 360, for example, the touch member TM1, and the inductor element LE1 may be changed from D to D1 less than D to generate eddy current. Thus, inductance formed by the eddy current may be reduced (Lind-ΔLind) to increase a resonant frequency (a sensing frequency). Based on this, force may be detected.

For example, the oscillation circuit 600 may generate an oscillation signal LCosc having frequency change characteristics depending on variation of inductance due to an interaction between the touch member TM1 having the conductor element 360 and the inductor element LE1 on the support member 300 when the force is input through the touch member TM1. As an example, the frequency change characteristics resulting from the force input may include an increase in a frequency and then decrease in a frequency as inductance is changed.

Further examples of the frequency change characteristics resulting from the force input will be described later with reference to FIG. 15.

Referring to FIGS. 7 and 8, the oscillation circuit 600 may generate an oscillation signal LCosc having second frequency change characteristics depending on variation of capacitance and variation of inductance when touch-force is input through the touch member TM1. As an example, the second frequency change characteristics may include a change in a frequency decreased, then increased, and then decreased as inductance is changed.

As described above, touch input, force input, and touch-force input may be distinguished and detected using a structure of a single touch sensing device. Examples of such a distinction and recognition operation will be further described below.

Figure 9:
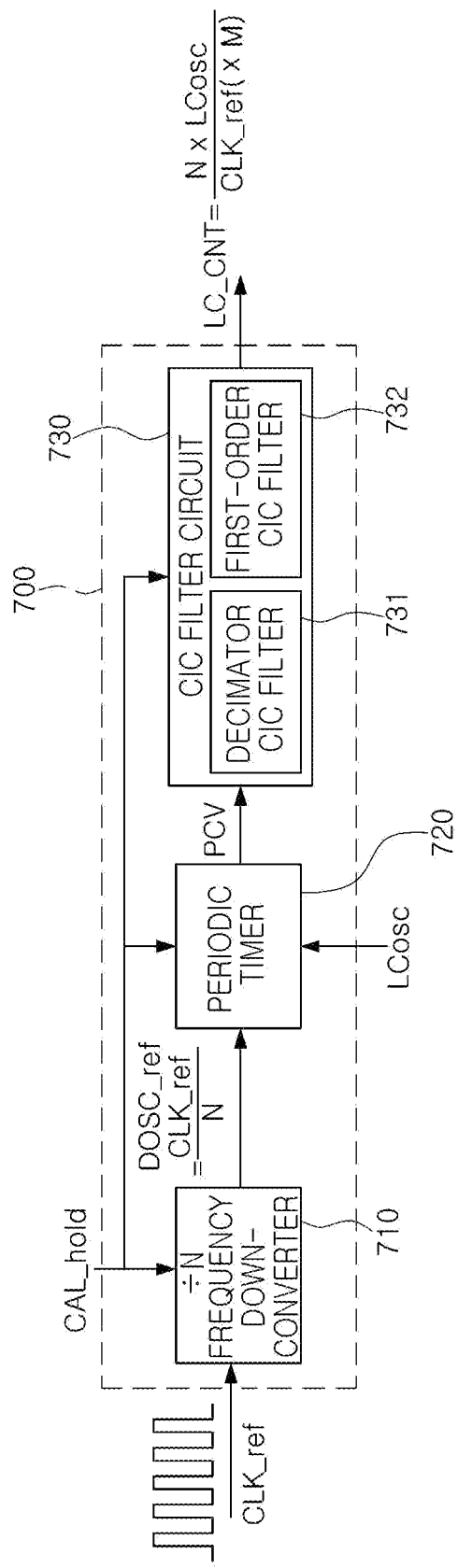
FIG. 9 illustrates one or more examples of a frequency digital converter.

FIG. 9 illustrates one or more examples of a frequency digital converter.

Referring to FIGS. 2 and 9, the frequency digital converter 700 may include a frequency down-converter 710, a periodic timer 720, and a cascade integrator-comb (CIC) filter circuit 730.

The frequency down-converter 710 may generate a reference clock signal (DOSC_ref=CLK_ref/N) determined by dividing a reference clock signal CLK_ref using a reference frequency division ratio N.

The periodic timer 720 counts one period of time of the divided reference clock signal DOSC_ref, received from the frequency down-converter 710, using the oscillation signal LCosc to generate a period count value PCV.

The CIC filter circuit 730 may perform cumulative amplification on the period count value PCV, received from the periodic timer 720, to generate a count value LC_CNT.

For example, as shown in Equation 2, the frequency digital converter 700 may divide the oscillation signal LCosc by a sensing frequency division ratio M and divide the reference frequency by the reference frequency division ratio N to count the divided reference clock signal using the divided oscillation signal.

$$LC\_CNT = (N \times LCosc)/(M \times CLK\_ref) \quad \text{Equation 2}$$

In Equation 2, LCosc denotes a frequency of an oscillation signal (an oscillation frequency), CLK_ref denotes a frequency of a reference clock signal (a reference frequency), N denotes a reference frequency (for example, 32 kHz) division ratio, and M denotes an oscillation frequency division ratio.

As shown in Equation 2, the phrase "dividing the oscillation frequency LCosc by the reference frequency CLK_ref" means that a period of the reference frequency CLK_ref is counted using the oscillation frequency LCosc. When the count value LC_CNT is obtained in the same manner, a low frequency reference frequency CLK_ref may be used and accuracy of a count may be improved.

The CIC filter circuit 730 may include a decimator CIC filter configured to output the count value LC_CNT generated by performing the cumulative amplification on the period count value PCV received from the periodic timer 720. The decimator CIC filter may determine a cumulative gain based on a preset integral stage order, decimator factor, and comb differential delay order.

As an example, the CIC filter circuit 730 may include the decimator CIC filter 731 and a first-order CIC filter 732. The decimator CIC filter 731 may amplify the input period count value LC_CNT using the received cumulative gain to output the count value LC_CNT.

For example, when the decimator CIC filter 731 includes an integrating circuit, a decimator, and a differential circuit, the cumulative gain may be obtained as $(R \times M)^S$ based on a stage order S of the integrating circuit, a decimator factor R, and a delay order M of the differentiating circuit. As an example, when the stage order S of the integrating circuit is 4, the decimator factor R is 1, and the delay order M of the differential circuit is 4, the cumulative gain may be $256(1 \times 4)^4$.

The first-order CIC filter 732 may take a moving average of a count value from the decimator CIC filter to remove noise.

Figure 10:
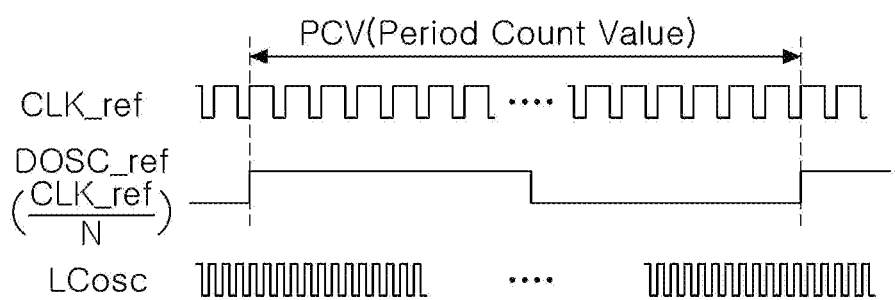
FIG. 10 illustrates one or more examples of main signals in FIG. 9.

FIG. 10 illustrates one or more examples of main signals in FIG. 9.

Referring to FIG. 10, as described above, a reference clock signal CLK_ref may be a reference signal input to the frequency down-converter 710, and may be a signal generated by an external crystal and may be an oscillation signal such as a phase-locked loop (PLL) or an resistor-capacitor (RC) in an integrated circuit (IC).

A divided reference clock signal DOSC_ref is generated by dividing the reference clock signal CLK_ref by a division ratio N in the frequency down-converter 710.

The oscillation signal LCosc is generated by the oscillation circuit 600, and a frequency of the oscillation signal LCosc may be higher than a frequency of the reference clock signal CLK_ref.

Figure 11:
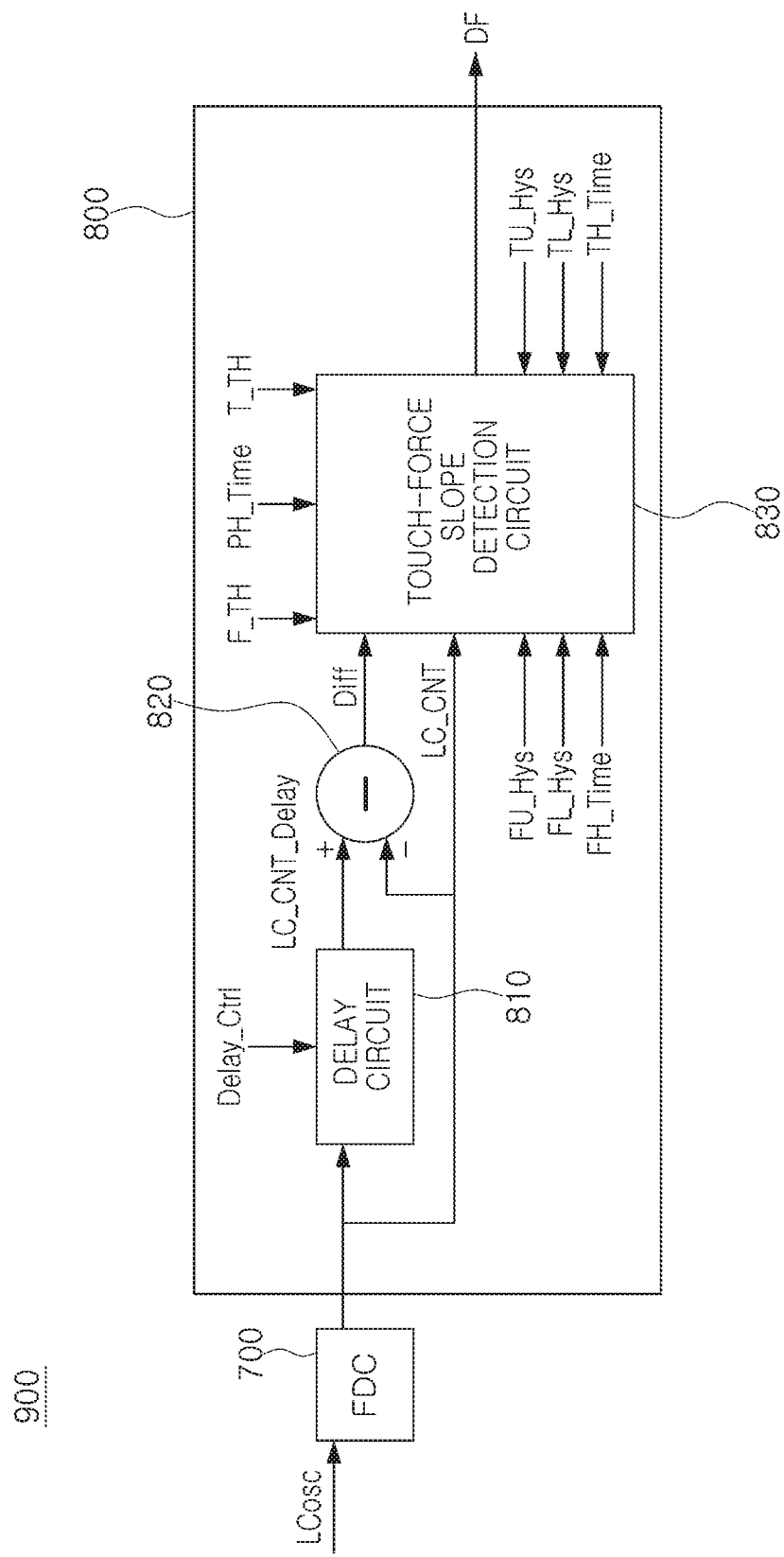
FIG. 11 illustrates one or more examples of an operation detector.

FIG. 11 illustrates one or more examples of an operation detector.

Referring to FIG. 11, the operation detector 800 may include a delay circuit 810, a subtraction circuit 820, and a touch-force slope detection circuit 830.

The delay circuit 810 may delay the count value LC_CNT received from the frequency digital converter 700 by a time determined based on a delay control signal Delay_Ctrl to generate a delayed count value LCa_CNT_Delay. The delay time may be determined depending on the delay control signal Delay_Ctrl.

The subtraction circuit 820 may subtract the count value LC_CNT from the delayed count value LC_CNT_Delay from the delay circuit 810 to generate a difference value Diff. The difference value Diff may be a slope variance of the count value LC_CNT. The count value LC_CNT corresponds to a currently counted value, and the delayed count value LC_CNT_Delay corresponds to a value counted before a predetermined delay time from the present.

The touch-force slope detection circuit 830 may compare the difference value Diff with each of the preset touch threshold value T_TH and the preset force threshold value F_TH to detect a touch, force, and touch-force, based on a comparison result. Thus, the touch-force slope detection circuit 830 may output a touch detection signal DF having different detection information.

For example, detection of the touch-force slope detection circuit 830 may be performed by selectively using two methods. One method is to detect a level using the count value LC_CNT prior to differentiation, and the other method is to use an amount of change using the difference value Diff. In the examples described herein, one of the two methods may be selectively used, and both of the two methods may be simultaneously applied.

For example, the touch-force slope detection circuit 830 may compare a difference value Diff for a touch-force slope, output from the subtraction circuit 820, with touch sections T_TH, TU_Hys, TL_Hys, and TH_Time and force sections F_TH, FU_Hys, FL_Hys, and FH_Time. When the difference value Diff is less than a touch threshold value T_TH, the touch-force slope detection circuit 830 may recognize it as a touch and may output a detection signal DF having first information. Meanwhile, when the difference value Diff is greater than a force threshold value F_TH, the touch-force slope detection circuit 830 may recognize it as force and may output a detection signal DF having second information. In addition, when the difference value Diff is less than or equal to the touch threshold T_TH for a predetermined time and greater than or equal to the force threshold F_TH, the touch-force slope detection circuit 830 may recognized it as touch-force and may output a detection signal DF having third information.

In the touch sections T_TH, TU_Hys, TL_Hys, and TH_Time, T_TH denotes a touch threshold value, TU_Hys and TL_Hys denote upper and lower limits of a touch hysteresis, TH_Time denotes a predetermined time for determining a touch maintaining time. In the force sections F_TH, FU_Hys, FL_Hys, and FH_Time, F_TH denotes a force threshold value, FU_Hys and FL_Hys denote upper and lower limits of a force hysteresis, and FH_Time denotes a predetermined time for determining force maintaining time.

As described above, when the difference value Diff for a slope is used, an error for a temperature drift may be prevented. When the touch sections T_TH, TU_Hys, and TL_Hys and the force sections F_TH, FU_Hys, and FL_Hys are used, sensing accuracy may be improved.

Figure 12:
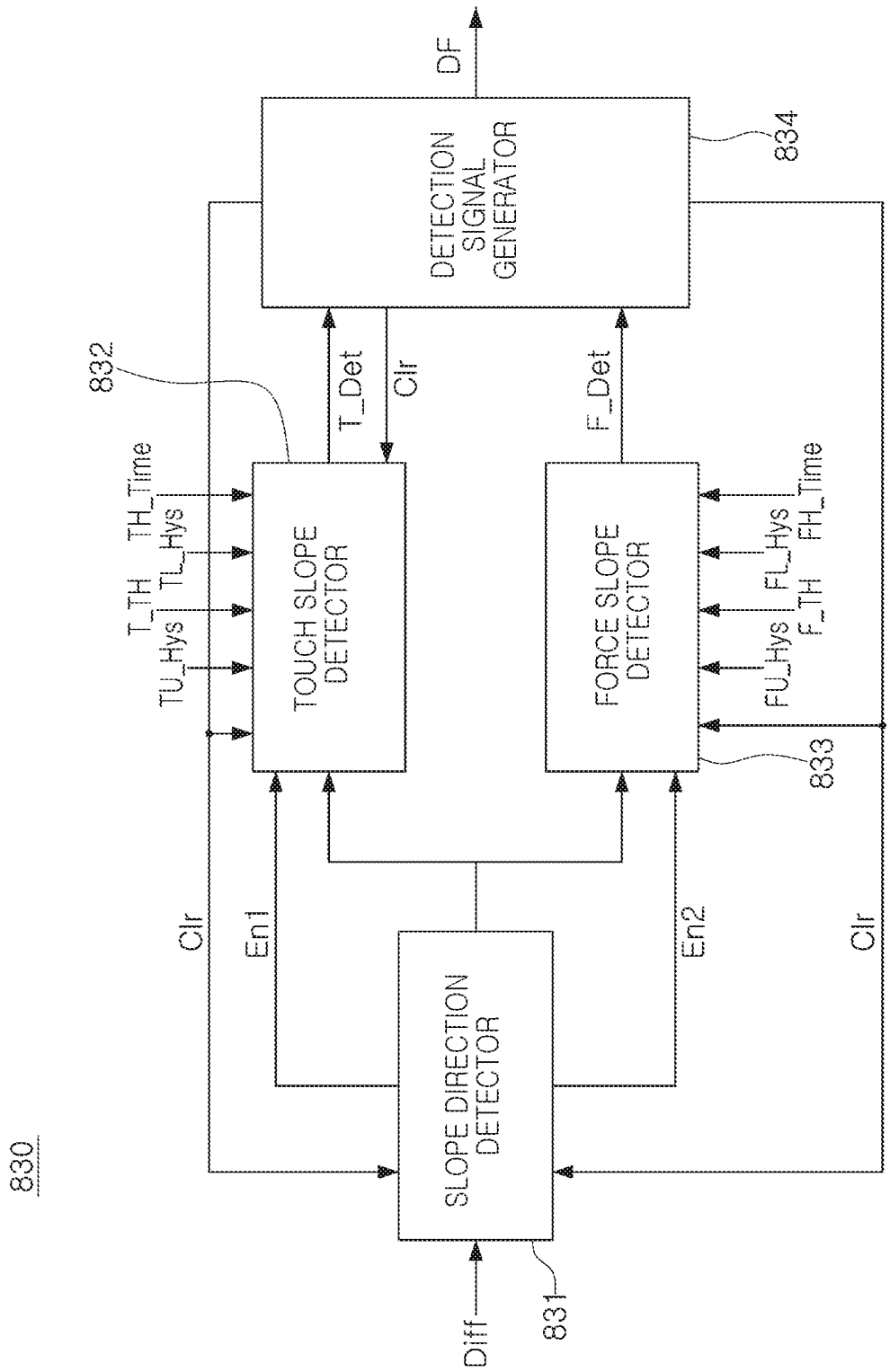
FIG. 12 illustrates one or more examples of a touch-force slope detection circuit.

FIG. 12 illustrates one or more examples of a touch-force slope detection circuit.

Referring to FIGS. 11 and 12, the touch-force slope detection circuit 830 may include a slope direction detector 831, a touch slope detector 832, a force slope detector 833, and a detection signal generator 834.

The slope direction detector 831 may determine whether the difference value Diff is a falling value or a rising value. When the difference value Diff is a falling value, the slope direction detector 831 may output a first enable signal En1=1 in an active state. When the difference value Diff is a rising value, the slope direction detector 831 may output a second enable signal En2=1 in an active state.

If the first enable signal En1 enters an active state En1=1, the touch slop detector 832 may generate a touch detection signal T_Det when the difference value Diff is less than or equal to the touch threshold value T_TH of the touch sections T_TH, TU_Hys, and TL_Hys for a predetermined time TH_Time.

If the second enable signal En2 enters an active state En2=1, the force slope detector 833 may generate a force detection signal F_Det when the difference value Diff is greater than or equal to the force threshold value F_TH of the force sections F_TH, FU_Hys, and FL_Hys for the predetermined time FH_Time.

The detection signal generator 834 may generate touch detection signals DF, having different detection information from each other, based on the touch detection signal T_Det and the force detection signal F_Det.

For example, the detection signal generator 834 may generate a touch detection signal DF, including detection information corresponding to touch input, when the difference value Diff rises after falling, based on the touch detection signal T_Det and the force detection signal F_Det, and may generate a touch detection signal DF, including detection information corresponding to force input when the difference value Diff falls after rising. In addition, the detection signal generator 834 may generate a touch detection signal DF, including detection information corresponding to force-touch input when the difference value Diff sequentially falls, rises, and falls.

As an example, a process of generating the sensing detection signal DF may be performed based on whether the touch detection signal T_Det and the force detection signal F_Det are activated separately or simultaneously and an activation time interval PH_Time of the signals T_Det and F_Det.

Finally, when generation of the detection signal DF is completed, the detection signal generator 834 may generate and provide an initialization signal Clr to the slope direction detector 831, the touch slope detector 832, and the force slope detector 833.

For example, the detection signal generator 834 may ultimately generate a detection signal DF based on two input signal values T_Det and F_Det. The process of generating the sensing signal is performed based on whether two signals T_Det and F_Det are activated and an activation time interval PH_Time of the two signals. When the signal generation is completed, the initialization signal Clr is generated in each detector to complete the operation.

Figure 13:
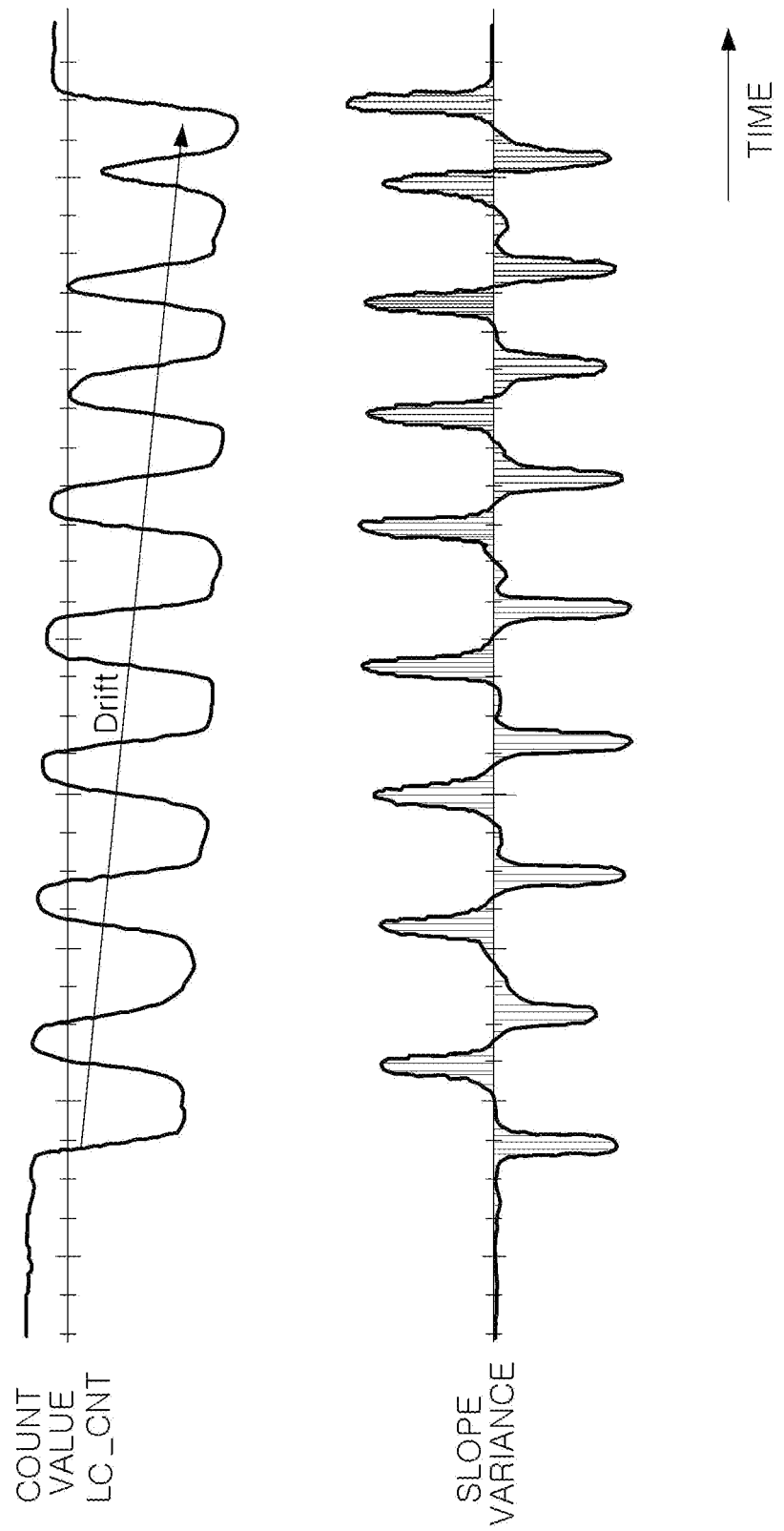
FIG. 13 illustrates an example of a drift of a count value and a slope variance when a touch is input.

FIG. 13 illustrates an example of a drift of a count value and a slope variance when a touch is input.

Referring to FIG. 13, when a touch member is continuously touched by a human part (a human hand), falling drift of a count value LC_CNT occurs due to a change in temperature of an inductor element through the touch member. Therefore, an influence caused by temperature drift may be excluded when a slope variance, rather than an absolute count level, is used to determine whether the touch member is touched.

Accordingly, in the touch of the human part (the human hand), a slope variance in an initial state may be confirmed by a state until a change of a rising threshold value or greater is detected after a change of a falling threshold value or less is detected.

In addition, when touch and force are mixed, both the touch and the force may be treated in one form including a touch slope and a force slope, for example, in one form including falling, rising, and falling.

Figure 14:
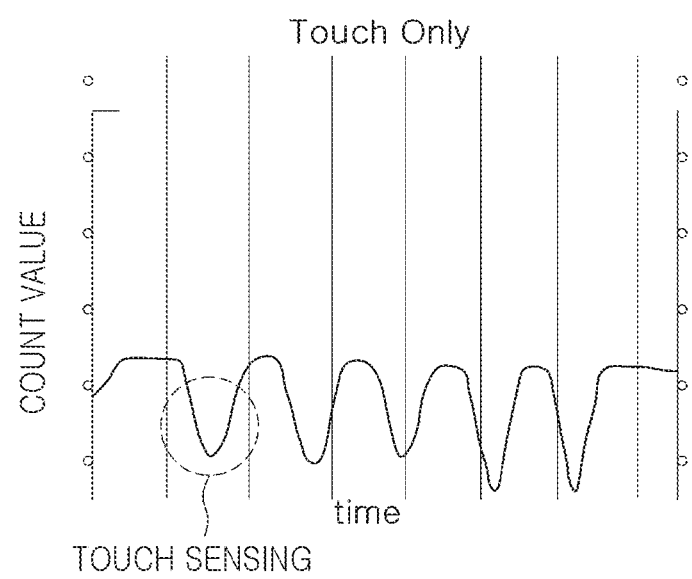
FIG. 14 illustrates an example of a count value exhibiting frequency change characteristics depending on touch only.
Figure 15:
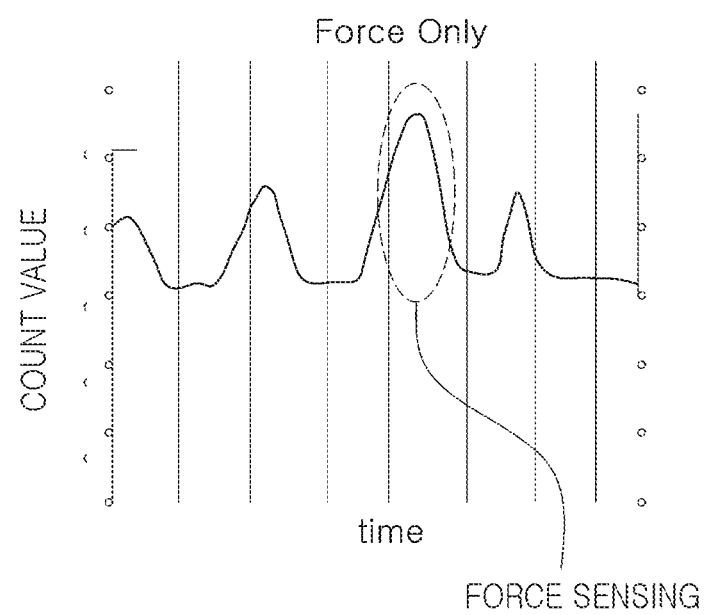
FIG. 15 illustrates an example of a count value exhibiting frequency change characteristics depending on force only.
Figure 16:
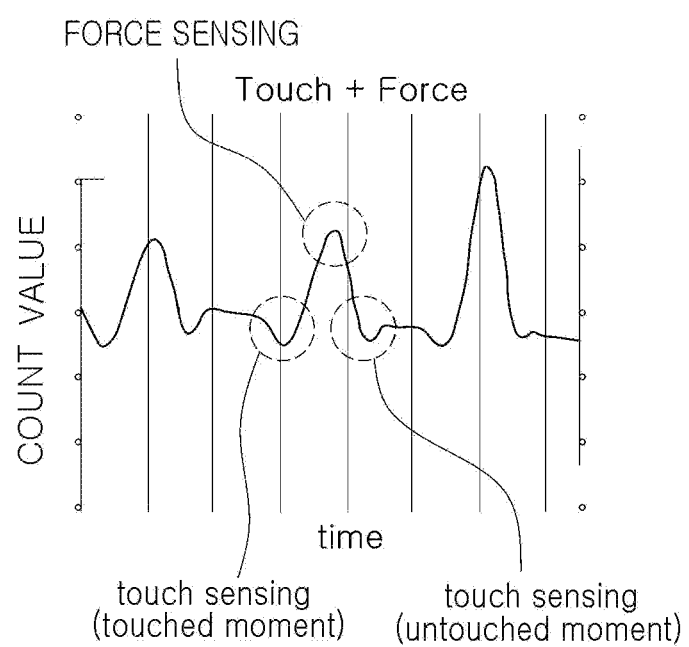
FIG. 16 illustrates an example of a count value exhibiting second frequency change characteristics depending on touch-force.

FIG. 14 illustrates an example of a count value exhibiting frequency change characteristics depending on touch only, and FIG. 15 illustrates an example of a count value exhibiting frequency change characteristics depending on force only. FIG. 16 illustrates an example of a count value exhibiting second frequency change characteristics depending on touch-force.

Hereinafter, a method of distinguishing touch and force using a single inductor element will be described with reference to FIGS. 14 to 16. FIG. 14 shows a waveform measured when a human hand approaches or slightly touches a touch member of a metal housing having the inductor element disposed inside of the touch member of the metal housing. FIG. 15 shows a waveform measured when a hand and a non-metal non-conductor touch the touch member of the metal housing having the inductor element to perform only a force operation without performing a touch operation. In addition, FIG. 15 shows a waveform measured when a touch operation and a force operation are sequentially performed by pressing the touch member of the metal housing having the inductor element with a gradually increasing force after slightly touching the touch member.

As an example, referring to FIG. 14, in the case in which a touch-only operation is performed, a count value is decreased by an operation in a capacitive manner and increases to an original state when the hand is released. If a slope value is checked based on the above, the slope value falls when touched and rises when touch is removed.

Referring to FIG. 15, in the case in which a force-only operation is performed, a count value is increased to a sensed count value by an operation in an inductive manner and is decreased to an original state when a touch material is released.

Referring to FIG. 16, in the case in which a touch operation and a force operation are simultaneously performed by a human hand, a touch operation (a capacitive manner) is performed to decrease a count value when the human hand is near a touched surface or slightly touches the touched surface. When a constant amount of force is then input to bend a touch member by hand, and thus, the touch member approaches an inductor element, a force operation (an inductive manner) is performed to increase the count value.

Figure 17:
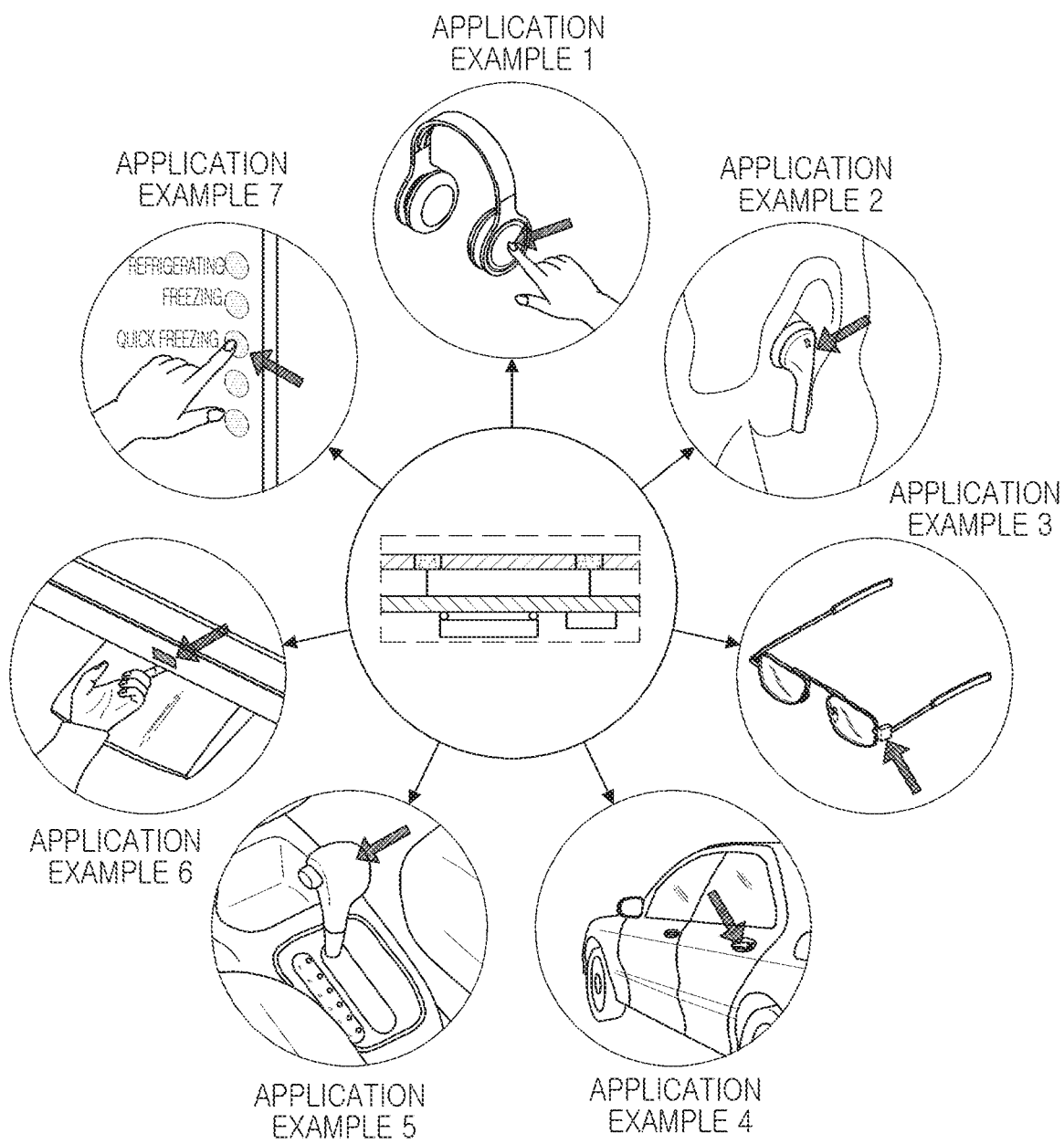
FIG. 17 illustrates application examples of a touch sensing device.

FIG. 17 illustrates application examples of a touch sensing device.

Referring to FIG. 17, Application Examples 1 to 7 of a touch operation sensing apparatus are illustrated.

Application Example 1 of FIG. 17 is an example in which a touch input sensing apparatus may be applied as an operation control button of Bluetooth® headphones, and Application Example 2 of FIG. 17 is an example in which a touch input sensing apparatus may be applied to an operation control button of a Bluetooth® earbud. As an example, Application Examples 1 and 2 may be examples in which touch input sensing apparatuses are on/off power switches of Bluetooth® headphones and a Bluetooth® earbud.

Application Example 3 of FIG. 17 is an example in which a touch input sensing apparatus may be an operation control button of smart glasses. As an example, Application Example 3 is an example in which a touch input sensing apparatus may be a button for performing functions such as a phone function and a mail function, a home button, and other buttons of a device such as Google Glasses, a virtual reality (VR) device, or an augmented reality (AR) device.

Application Example 4 of FIG. 17 is an example in which a touch input sensing apparatus may be a door lock button of a vehicle. Application Example 5 of FIG. 17 is an example in which a touch input sensing apparatus may be a button of a smart key of a vehicle. Application Example 6 of FIG. 17 is an example in which a touch input sensing apparatus may be an operation control button of a computer. Application Example 7 of FIG. 17 is an example in which a touch input sensing apparatus may be an operation control button of a refrigerator.

In addition, a touch input sensing apparatus may be applied to volume and power switches of a laptop computer, a switch of a VR device, a head-mounted display (HMD), a Bluetooth earphone, a stylus touch pen, or the like, and may be applied to buttons of a monitor of a home appliance, a refrigerator, a laptop computer, or the like.

For example, a touch input sensing apparatus applied to an operation control button of a device may be integrated with a cover, a frame, or a housing of the applied device, and may be used to turn power on and off, control a volume, and perform other specific functions (back, movement to home, locking, and the like).

In addition, a plurality of touch input sensing apparatuses may be provided to perform a plurality of functions when corresponding functions (back, movement to home, locking, and the like) are performed.

The touch operation sensing apparatus of the examples disclosed herein is not limited to the above-described apparatuses and may be applied to a mobile device, a wearable device, and the like, requiring an operation such as a switch. In addition, a touch sensing device of this application may be applied to implement an integrated design.

When one or more of the above-described examples is applied to a mobile device, a thinner, simpler, and tidier design may be implemented, and an analog-to-digital converter (ADC) is not required, unlike a capacitive sensing manner. When a coil element is directly attached to a target surface of a touch member as an application structure, an electric device may be easily implemented because there is no spacer structure. In addition, a switch having dustproof and waterproof functions may be implemented and sensing may be performed even in a humid environment.

As described above, the examples disclosed herein address a conventional issue that coil sensors (for example, inductor elements) should be provided for touch sensing and force sensing, respectively.

In the examples described herein, both capacitive sensing, using capacitor characteristics that a part of a human body has when a touch is input, and inductive sensing, using a change in eddy current caused by a change in a distance between an inductor element and a conductor, may be performed using a single sensor structure. In addition, a touch input and a touch-force input may be distinguished and recognized.

By using a support member such as a bracket, or the like, supporting a conductor disposed therein, a predetermine distance between the inductor element and the conductor may be more certainly maintained to stably perform inductive sensing. In addition, since an inductor element, a capacitor element, and a circuit part are not directly attached to a housing, components such as the inductor element, the capacitor element, and the circuit part may be easily replaced even when a defect occurs in the components.

In addition, a distance between an inductor element and a conductor inside the above-described support member may be constantly maintained using the support member. Thus, a manufacturing process tolerance may be reduced to improve accuracy of the inductive sensing and to increase yield.

While specific examples have been shown and described above, it will be apparent after an understanding of this disclosure that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A touch sensing device configured to be installed in an electric device, the electric device comprising a housing and a touch member integrated with the housing, the touch sensing device comprising:
    an inductor element configured to be spaced apart from an internal side surface of the touch member;
    a support member configured to be disposed on an internal side surface of the housing or the internal side surface of the touch member to support the inductor element;
    a substrate on which the inductor element is disposed, the substrate being disposed on the support member; and
    a circuit part connected to the inductor element and configured to detect a touch input through the touch member and a touch-force input through the touch member based on different frequency change characteristics depending on a capacitance corresponding to the touch input through the touch member and a displacement of the touch member corresponding to the touch-force input through the touch member.

2. The touch sensing device of claim 1, wherein the substrate is disposed between the support member and the inductor element.

3. The touch sensing device of claim 1, wherein the circuit part comprises an amplifier circuit and an operation detection circuit,
    wherein the touch sensing device further comprises an oscillation circuit comprising the amplifier circuit and a capacitor element disposed on the substrate, the oscillation circuit being configured to generate an oscillation signal having first frequency change characteristics depending on a parasitic capacitance formed in the substrate by the touch being input through the touch member, and having second frequency change characteristics depending on a change in a distance between the touch member and the inductor element caused by a force being input through the touch member, and
    wherein the operation detection circuit is configured to detect the touch input through the touch member and the touch-force input through the touch member based on the first and second frequency change characteristics of the oscillation signal.

4. The touch sensing device of claim 3, wherein the support member comprises:
    one end attached to a portion of the internal side surface of the housing or a portion of the internal side surface of the touch member;
    another end attached to another portion of the internal side surface of the housing or another portion of the internal side surface of the touch member; and a support extending between the one end and the other end and spaced apart from the internal side surface of the housing or the internal side surface of the touch member, and wherein the support is made of a conductor and supports the substrate.

5. The touch sensing device of claim 3, wherein the oscillation circuit further comprises:
an inductance circuit comprising the inductor element disposed on the substrate; and
a capacitance circuit comprising the capacitor element disposed on the substrate, the capacitance circuit being connected to the inductance circuit, and
wherein the amplifier circuit is configured to generate the oscillation signal to have a resonant frequency of the inductance circuit and the capacitance circuit.

6. The touch sensing device of claim 3, wherein the oscillation circuit is further configured to generate the oscillation signal to have the first frequency change characteristics based on a change in a capacitance caused by the parasitic capacitance being formed in the substrate by the touch being input through the touch member, and to have the second frequency change characteristics based on the change in the capacitance caused by the parasitic capacitance being formed in the substrate by the touch-force being input through the touch member, and a change in an inductance caused by the change in the distance between the touch member and the inductor element caused by the touch-force being input through the touch member.

7. The touch sensing device of claim 3, wherein the operation detection circuit comprises:
a frequency digital converter configured to count a clock signal using the oscillation signal to generate a count value; and
an operation detector configured to detect either one or both of the touch input through the touch member and the touch-force input through the touch member based on the count value.

8. The touch sensing device of claim 7, wherein the frequency digital converter comprises:
a frequency down-converter configured to divide a reference clock signal using a reference frequency division ratio to generate a divided reference clock signal;
a periodic timer configured to count one period of time of the divided reference clock signal using the oscillation signal to generate a periodic count value; and
a cascade integrator-comb (CIC) filter circuit configured to perform cumulative amplification on the periodic count value to generate the count value.

9. The touch sensing device of claim 8, wherein the operation detector comprises:
a delay circuit configured to delay the count value by a time determined by a delay control signal to generate a delayed count value;
a subtraction circuit configured to subtract the count value from the delayed count value to generate a difference value; and
a touch-force slope detection circuit configured to compare the difference value with each of a preset touch threshold value and a preset force threshold value, and output touch detection signals having mutually different detection information based on a result of the comparison.

10. The touch sensing device of claim 1, wherein the support member comprises:

one end attached to a portion of the internal side surface of the housing or a portion of the internal side surface of the touch member through a first insulating member;
another end attached to another portion of the internal side surface of the housing or another portion of the internal side surface of the touch member through a second insulating member; and
a support extending between the one end and the other end and spaced apart from the internal side surface of the housing or the internal side surface of the touch member, and
wherein the support is made of a conductor and supports the substrate.

11. The touch sensing device of claim 1, wherein the support member comprises:
one end attached to a portion of the internal side surface of the housing or a portion of the internal side surface of the touch member;
another end attached to another portion of the internal side surface of the housing or another portion of the internal side surface of the touch member;
a support extending between the one end and the other end and spaced apart from the internal side surface of the housing or the internal side surface of the touch member; and
a conductive member connected to a portion of the internal side surface of the housing or a portion of the internal side surface of the touch member and disposed on a portion, or an entirety, of an area between the substrate and the support, and
wherein the support is made of an insulator and supports the substrate.

12. An electric device comprising:
a housing;
a touch member integrated with the housing;
an inductor element spaced apart from an internal side surface of the touch member;
a support member disposed on an internal side surface of the housing or the internal side surface of the touch member to support the inductor element;
a substrate on which the inductor element is disposed, the substrate being disposed on the support member; and
a circuit part connected to the inductor element and configured to detect a touch input through the touch member and a touch-force input through the touch member based on different frequency change characteristics depending on a capacitance corresponding to the touch input through the touch member and a displacement of the touch member corresponding to the touch-force input through the touch member.

13. The electric device of claim 12, wherein the circuit part comprises an amplifier circuit and an operation detection circuit,
wherein the electric device further comprises an oscillation circuit comprising the amplifier circuit and a capacitor element disposed on the substrate, the oscillation circuit being configured to generate an oscillation signal having first frequency change characteristics depending on a parasitic capacitance formed in the substrate by the touch being input through the touch member, and having second frequency change characteristics depending on a change in a distance between the touch member and the inductor element caused by a force being input through the touch member, and
wherein the operation detection circuit is configured to detect the touch input through the touch member and the touch-force input through the touch member based on the first and second frequency change characteristics of the oscillation signal.

14. The electric device of claim 13, wherein the support member comprises:
one end attached to a portion of the internal side surface of the housing or a portion of the internal side surface of the touch member;
another end attached to another portion of the internal side surface of the housing or another portion of the internal side surface of the touch member; and
a support extending between the one end and the other end and spaced apart from the internal side surface of the housing or the internal side surface of the touch member, and
wherein the support is made of a conductor and supports the substrate.

15. The electric device of claim 13, wherein the oscillation circuit further comprises:
an inductance circuit comprising the inductor element disposed on the substrate; and
a capacitance circuit comprising the capacitor element disposed on the substrate, the capacitance circuit being connected to the inductance circuit, and
wherein the amplifier circuit is configured to generate the oscillation to have a resonant frequency of the inductance circuit and the capacitance circuit.

16. The electric device of claim 13, wherein the oscillation circuit is further configured to generate the oscillation signal to have the first frequency change characteristics based on a change in a capacitance caused by the parasitic capacitance being formed in the substrate by the touch being input through the touch member, and to have the second frequency change characteristics based on the change in the capacitance caused by the parasitic capacitance being formed in the substrate by the touch-force being input through the touch member, and a change in an inductance caused by the change in the distance between the touch member and the inductor element caused by the touch-force being input through the touch member.

17. The electric device of claim 13, wherein the operation detection circuit comprises:
a frequency digital converter configured to count a clock signal using the oscillation signal to generate a count value; and
an operation detector configured to detect either one or both of the touch input through the touch member and the touch-force input through the touch member based on the count value.

18. The electric device of claim 17, wherein the frequency digital converter comprises:
a frequency down-converter configured to divide a reference clock signal using a reference frequency division ratio to generate a divided reference clock signal;
a periodic timer configured to count one period of time of the divided reference clock signal using the oscillation signal to generate a periodic count value; and
a cascade integrator-comb (CIC) filter circuit configured to perform cumulative amplification on the periodic count value to generate the count value.

19. The electric device of claim 18, wherein the operation detector comprises:
a delay circuit configured to delay the count value by a time determined by a delay control signal to generate a delayed count value;
a subtraction circuit configured to subtract the count value from the delayed count value to generate a difference value; and
a touch-force slope detection circuit configured to compare the difference value with each of a preset touch threshold value and a preset force threshold value, and output touch detection signals having mutually different detection information based on a result of the comparison.

20. The electric device of claim 12, wherein the support member comprises:
one end attached to a portion of the internal side surface of the housing or a portion of the internal side surface of the touch member through a first insulating member;
another end attached to another portion of the internal side surface of the housing or another portion of the internal side surface of the touch member through a second insulating member; and
a support extending between the one end and the other end and spaced apart from the internal side surface of the housing or the internal side surface of the touch member, and
wherein the support is made of a conductor and supports the substrate.

21. The electric device of claim 12, wherein the support member comprises:
one end connected to a portion of the internal side surface of the housing or a portion of the internal side surface of the touch member;
another end attached to another portion of the internal side surface of the housing or another portion of the internal side surface of the touch member;
a support extending between the one end and the other end and spaced apart from the internal side surface of the housing or the internal side surface of the touch member; and
a conductive member attached to a portion of the internal side surface of the housing or a portion of the internal side surface of the touch member and disposed on a portion, or an entirety, of an area between the substrate and the support, and
wherein the support is made of an insulator and supports the substrate.

22. The electric device of claim 12, wherein the substrate is disposed between the support member and the inductor element.

* * * * *